United States Patent [19]

White

[11] Patent Number: 4,532,002

[45] Date of Patent: Jul. 30, 1985

[54] MULTILAYER PLANARIZING STRUCTURE FOR LIFT-OFF TECHNIQUE

[75] Inventor: Lawrence K. White, W. Windsor Township, Mercer County, N.J.

[73] Assignee: RCA Corporation, Princeton, N.J.

[21] Appl. No.: 598,745

[22] Filed: Apr. 10, 1984

[51] Int. Cl.$^3$ .................. B44C 1/22; C03C 15/00; C03C 25/06; B29C 17/08

[52] U.S. Cl. .................. 156/643; 156/651; 156/652; 156/653; 156/655; 156/657; 156/659.1; 156/668; 427/90; 430/315; 430/317

[58] Field of Search ............. 156/643, 646, 650–653, 156/655, 657, 659.1, 668; 204/192 E; 427/38, 39, 88, 89, 90, 91, 96; 29/580, 591; 430/313, 314, 315, 317

[56] References Cited

U.S. PATENT DOCUMENTS

| | | | |
|---|---|---|---|
| T103,203 | 7/1983 | Carr et al. | 427/91 |
| 4,337,115 | 6/1982 | Ikeda et al. | 156/659 |
| 4,352,870 | 10/1982 | Howard et al. | 430/271 |
| 4,367,119 | 1/1983 | Logan et al. | 156/643 |
| 4,370,405 | 1/1983 | O'Toole et al. | 430/312 |
| 4,372,034 | 2/1983 | Bohr | 29/577 |

Primary Examiner—William A. Powell
Attorney, Agent, or Firm—Birgit E. Morris; R. Hain Swope

[57] ABSTRACT

An improved method of forming a patterned layer of metallization on a substrate having topographical features is provided. A layer of a polymeric lift-off material is initially spin-coated onto the substrate, and a layer of a polymeric planarizing material spin-coated thereover. The dry etch rate of the lift-off layer is at least 1.2 times faster than that of the planarizing layer thereby forming a reverse slope wall profile in openings etched through both layers. A patterned hardmask layer is suitably used to dry etch the planarizing and lift-off layers, preferably in an oxygen-containing plasma. A layer of metallization is then deposited thereon. The metal in the openings is discontinuous from that deposited over the hardmask because of the reverse slope wall profile of the openings in the planarizing layers. The structure is then contacted with an organic solvent which penetrates to the base of the lift-off layer, again due to the reverse slope wall profile. The entire structure can thereupon be lifted from the substrate leaving the patterned metallization.

12 Claims, 5 Drawing Figures

MULTILAYER PLANARIZING STRUCTURE FOR LIFT-OFF TECHNIQUE

This invention relates to an improvement in the deposition of a patterned layer of a material, particularly a metal, onto a substrate having topographical features by lift-off techniques.

BACKGROUND OF THE INVENTION

In the fabrication of electronic devices it is frequently necessary to provide a patterned layer of metallization, generally aluminum, which functions, for example, as interconnections among devices on a substrate. One method of forming such a layer of metallization is to coat the entire suface of the substrate and then wet or dry etch the coating leaving only the desired fine line pattern. This method suffers certain disadvantages, particularly with regard to the patterning of a layer of aluminum.

Utilizing conventional lithographic techniques, a layer of resist material is deposited over the metallization layer, irradiated and developed, thus exposing the portion of the underlying metal layer to be etched away. The pattern irradiation of a resist layer with light, e.g. ultraviolet light, can suffer from a loss of resolution when the metallization is a reflective material such as aluminum. The problem of resolution loss due to reflection can be minimized by irradiating the resist layer with electron beam. Electron beam irradiation of most of the resist layer surface, however, is economically unattractive.

In either instance, dry etching of the layer of metallization is preferred over wet chemical etching due to superior resolution. However, dry etching of most of the substrate surface may be undesirable due to the possibility of damage to sensitive devices in the substrate surface. An alternative for the deposition of a patterned layer of metallization is the use of lift-off techniques.

Lift-off techniques require a multilayer structure comprising a lift-off layer and at least one overlying layer. Upon irradiation of the overlying layer or layers and development of the multilayer structure, the lift-off layer must undercut the overlying structure, ideally to a predictable degree. The undercut profile of the vias formed in the structure has two functions. First, a layer of metallization deposited over the structure will break in the vias and deposit in a pattern on the substrate which corresponds to that formed in the top layer of the lift-off structure. Second, the undercut profile enables a solvent for the lift off layer to penetrate to the substrate surface and lift off the entire structure, leaving only the patterned layer of metallization deposited in the vias. Both of these functions are essential for an effective lift-off technique.

There are, however, problems inherent in the use of lift-off techniques. For example, it is difficult to obtain structures with the necessary profile for effective lift-off with the degree of reproducibility necessary for commercial use. It has also been found that the solubility of certain materials heretofore utilized as the lift-off layer in conventional structures is significantly reduced by the heat treatments which may be required in connection with metallization deposition thereby making removal of the structure very difficult.

The presence of topography on the substrate is another factor to be contended with in developing an effective lift-off structure. The bottom or lift-off layer in such a structure tends to be thicker at the base and sides of a raised feature on the substrate and be thinner at the edges and on top. The uneven thickness of the lift-off layer over topography makes it very difficult to consistently obtain the necessary via profile for effective lift-off.

The improved process of this invention utilizes a structure which possesses superior lift-off capabilities, particularly wherein deposition of a desired material is to be on a substrate having topography.

SUMMARY OF THE INVENTION

An improved process for the deposition of a patterned layer of material on the surface of a substrate having topographical features comprises depositing a lift-off layer and an overlying planarizing layer on the substrate, the lift-off layer having a faster etch rate than the planarizing layer. Both the lift-off and planarizing layers are polymeric and are applied by spin-coating. The resulting two-layer structure is dry etched using a hardmask. The vias etched through the structure have a reverse slope wall profile as a result of undercutting by the lift-off layer. The degree of the slope of the via wall profile can be controlled by varying the thickness of the layers, their composition and the like. The reverse slope wall profile is well suited to the deposition of a material to be patterned by lift-off techniques.

DETAILED DESCRIPTION OF THE INVENTION

In accordance with this invention, a process is provided for depositing a layer of material, usually a metal, on a substrate having topographical features. The variations in thickness of the layers of a lift-off structure overlying surface topography make it difficult to achieve the film break in the layer being deposited which is necessary for lift off to take place. It is also necessary that vias etched through the structure have a reproducible reverse slope profile so that a solvent can penetrate to the bottom of the lift-off layer thus completely removing the structure after deposition has been carried out. The reverse slope is also necessary to minimize unwanted material on the sidewalls of vias which can affect coverage by the layer of material being deposited.

In order to produce the film break necessary for proper lift-off techniques, lift-off structures which are less conformal to the substrate topography are generally preferred. However, in order to obtain maximum step coverage for substrates having topography, conformal structures are generally preferred. It is also necessary to provide maximum planarization of the substrate topography in order to obtain optimum pattern delineation of the overlying resist layer or layers. The lift-off structures utilized in the process of this invention not only meet all of these requirements, but and have been found to provide an additional benefit.

When a conventional multilayer resist system overlying topographical features on a substrate is dry developed, i.e. plasma etched, the developing plasma will reach a raised feature well before it reaches a lower feature or the substrate surface. Therefore, by the time an opening has been satisfactorily etched to the lower substrate surface, a substantial amount of over-etching may have unavoidably taken place where an opening had been made over raised topography. Over-etching, particularly extended over-etching, can cause damage to the raised feature, substantial undercutting or, more frequently, both. Such over-etching is substantially reduced in accordance with the method of this invention which utilizes a lift-off structure having a lift-off layer with an etch rate at least 1.2 times faster than that of the overlying planarizing layer.

The substrates receiving a patterned layer of metallization in accordance with this invention may be any suitable material, for example, single crystalline silicon, gallium arsenide, tungsten, polycrystalline materials with suitable surfaces, vitreous materials or the like. The substrate generally will be appropriately doped to provide regions of varying conductivity. A preferred substrate is a single crystal silicon wafer. The topographical features on the substrate typically are devices, device subassemblies, silicon islands, mesas, circuit components and the like. The exact nature of such features is not critical to the subject invention.

Figure 1:
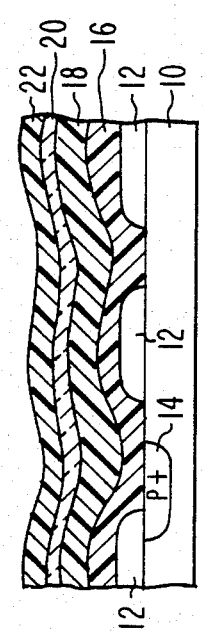

As shown in FIG. 1, a substrate 10 having raised topographical features 12 and an area of conductivity 14 is spin-coated with a polymeric lift-off layer 16. The thickness of the lift-off layer 16 is suitably from about 0.3 to 2 times the height of the highest topographical feature 12 on the substrate. Preferably, the thickness of the lift-off layer 16 is at least equal to the height of the highest feature 12. The thickness of the lift-off layer depends on the thickness of the subsequently deposited metallization and the desired via wall profile. In general, the lift-off layer is from about 0.3 to about two micrometers in thickness. The lift-off layer 16 has an etch rate at least 1.2, preferably at least two, times faster than that of the planarizing layer 18 which overlies it.

A number of polymeric materials can be utilized as the lift-off layer in the structures of this invention. A particularly preferred material for the lift-off layer is PMMA, i.e. poly(methylmethacrylate). Among other suitable polymers are chlorine-containing polymers which have etch rates substantially higher than most other polymers. Examples of such polymers include poly(chloroprene), poly(epichlorohydrin), poly(vinylchloride), chlorinated polyethylene and the like. The lift-off layer, in addition to possessing suitable dry etch rate characteristics must be compatible with both the substrate and the overlying layers. It is also important that the materials utilized for the lift-off layer in the subject process, particularly PMMA, have planarizing capabilities which is beneficial to the structure as a whole.

The lift-off layer 16 is spin-coated with a planarizing layer 18 of a slower etching polymer material. The slower etching layer 18, in addition to providing planarization, promotes improved edge acuity at the top of etched vias. The planarizing layer 18 may also function to improve adhesion between the overlying hardmask 20 and the lift-off layer 16. The thickness of the planarizing layer 18 is suitably from about 0.2 to 5.0 times that of the lift-off layer 16, measured on a flat plane. The combined thickness of the lift-off layer 16 and the planarizing layer 18 is at least equal to the highest topographical feature on the substrate. Preferably, the two layers are approximately equal in thickness. The wall profile of the vias can be varied by changing the relative thicknesses of these two layers.

Suitable polymer materials for the slow etching planarizing layer 18 include novolac resin-based positive resist materials, for example, HPR 204 and HPR 206 of Hunt Chemical Co., AZ 1470 of the Shipley Co., Kodak 800 of Eastman Kodak, OFPR of Dynachem Corporation and the like. Rubber-based, negative acting polymeric resist materials are also suitable. The preferred materials are resists primarily because the commercial resist products have a very high purity and, hence, reproducibility. It is not necessary that the planarizing layer be a resist material.

Referring again to FIG. 1, overlying the slower etching planarizing layer 18 is a layer of conventional hardmask material 20 such as, for example, silicon dioxide, silicon nitride, amorphous silicon and the like. The hardmask layer 20 is suitably thin, e.g. from about 200 to 6000, preferably about 2000, angstroms in thickness. The hardmask 20 is suitably applied by conventional techniques such as evaporation, sputtering, chemical vapor deposition (CVD), or low pressure chemical vapor deposition (LPCVD). Liquid preparations which yield a film of silicon dioxide upon drying and baking may be applied by spin-coating.

Figure 2:
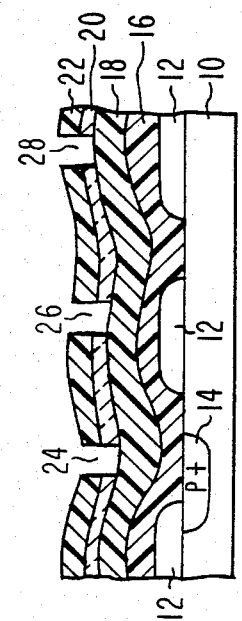

In accordance with the process of this invention, the hardmask 20 is patterned utilizing conventional resist processing techniques, i.e. a layer of resist 22 is deposited thereover, irradiated and developed, thus exposing a portion of the hardmask which is then removed by wet or, preferably, dry etching techniques. The resulting structure is shown in FIG. 2. Removal of the remaining resist layer 22 is not necessary as will be discussed.

Figure 3:
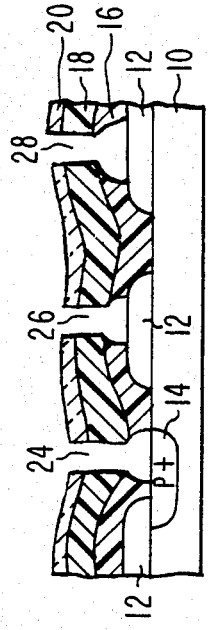
FIGS. 1–5 are elevational views in cross section illustrating the steps of the process of this invention.

Utilizing the hardmask 20 as a pattern, the lift-off layer 16 and planarizing layer 18 are dry etched to open vias to the underlying substrate. The undercutting of the planarizing layer 18 by the lift-off layer 16 produces the desired reverse slop lift-off profile in the vias 24, 26 and 28 as clearly illustrated in FIG. 3. Plasmas particularly useful in etching these polymeric layers include oxygen, mixtures of various gases with oxygen, carbon tetrafluoride and the like. Generally, the remainder of the patterned resist layer overlying the hardmask will be removed during this etching period.

Figure 4:
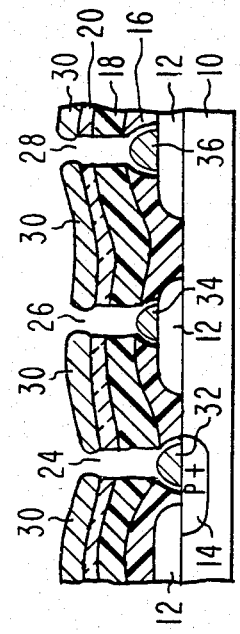

A layer of metallization 30 is then deposited by conventional technique over the structure, generally, directly over the hardmask as shown in FIG. 4. The metallization layer 30 is typically aluminum, or an alloy thereof with silicon or silicon and copper. As a result of the height of the lift-off structure and, more importantly, the reverse slope of the wall profile of the vias caused by the undercutting of the faster etching lift-off layer 16, the metallization deposit breaks at the vias and deposits over the hardmask 20 and in the bottom of vias 24, 26 and 28 without appreciably coating the sidewalls. Thus, metal deposits 32, 34 and 36 form cleanly in the bottom of the vias as shown in FIG. 4.

Figure 5:
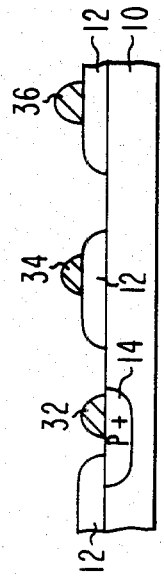

The reverse wall profile of the vias, which results primarily from undercutting of the slower etching planarizing layer 18 by the faster etching lift-off layer 16, enables an organic solvent to penetrate under the lift-off layer 16 and cause the entire overlying structure to be lifted cleanly from the substrate leaving the patterned metal layer deposits 32, 34 and 36 as shown in FIG. 5. Suitable organic solvents include chlorobenzene, toluene, acetone, methylethylketone and the like.

Lift-off of the subject structure is clean, even over raised topography. The more rapid etch rate of lift-off layer 16 not only produces the necessary wall profile, but substantially reduces the potential for damage to raised topography 12 by over-etching in the time required to complete etching through the layers 16 and 18 to the surface of substrate 10.

The invention has been described with reference to preferred embodiments thereof. It will be appreciated by those skilled in the art that various modifications may be made from the specific details given without departing from the spirit and scope of the invention.

I claim:

1. A method of forming a patterned layer of metallization on a substrate having topographical features which comprises:
   (a) spin-coating on the substrate a layer of a polymeric lift-off material and, thereover, a layer of a polymeric planarizing material, wherein the dry etch rate of the lift-off layer is at least 1.2 times faster than that of the planarizing layer;
   (b) dry etching said layers selectively to form openings therethrough, the openings having a reverse slope wall profile as a result of the difference in etch rates of said layers;
   (c) depositing a layer of metallization over the resulting structure, the reverse slope wall profile causing the metallization deposited in said openings to separate from that overlying said planarizing layer;
   (d) contacting the resulting structure with an organic solvent to separate the lift-off layer from the substrate; and
   (e) removing said structure from the substrate.

2. A method in accordance with claim 1, wherein the etch rate of said lift-off layer is at least two times faster than that of the planarizing layer.

3. A method in accordance with claim 1, wherein the lift-off layer is a polymer selected from the group consisting of poly(methylmethacrylate, poly(chloroprene), poly(epichlorohydrin), poly(vinylchloride), and chlorinated polyethylene.

4. A method in accordance with claim 3, wherein the lift-off layer is poly(methylmethacrylate).

5. A method in accordance with claim 1, wherein the planarizing layer is a novolac resin-based positive resist material or a rubber-based negative resist material.

6. A method in accordance with claim 1, wherein the thickness of the lift-off layer is from about 0.3 to about 2 times the height of the highest topographical feature on the substrate.

7. A method in accordance with claim 1, wherein the thickness of the planarizing layer is between about 0.2 and 5.0 times the thickness of the lift-off layer, with the provision that the thickness of the lift-off layer plus the planarizing layer is at least equal to the height of the highest topographical feature on the substrate.

8. A method in accordance with claim 7, wherein the lift-off and the planarizing layers are of about equal thickness.

9. A method in accordance with claim 1, wherein said lift-off and planarizing layers are etched utilizing a hardmask formed by depositing a layer of suitable hardmask material thereover, providing a patterned layer of resist material thereon and etching the exposed portion of the hardmask layer.

10. A method in accordance with claim 9, wherein said hardmask material is silicon dioxide, silicon nitride or amorphous silicon.

11. A method in accordance with claim 9, wherein the exposed portion of the hardmask layer is removed by plasma etching.

12. A method in accordance with claim 1, wherein the metallization is aluminum or an alloy thereof.

* * * * *